United States Patent

Bauer

[11] Patent Number: 6,098,459
[45] Date of Patent: Aug. 8, 2000

[54] METHOD OF PRODUCING A SENSOR SUBASSEMBLY, AND SENSOR SUBASSEMBLY

[75] Inventor: Hans-Peter Bauer, Regensburg, Germany

[73] Assignee: Siemens Aktiengesellschaft, Munich, Germany

[21] Appl. No.: 09/426,419

[22] Filed: Oct. 25, 1999

Related U.S. Application Data

[63] Continuation of application No. PCT/DE98/01130, Apr. 22, 1998.

[30] Foreign Application Priority Data

Apr. 24, 1997 [DE] Germany .......................... 197 17 348

[51] Int. Cl.⁷ .................................................. G01D 11/24
[52] U.S. Cl. ............................................. 73/431; 73/493
[58] Field of Search ............................. 73/493, 431, 488, 73/514.01

[56] References Cited

U.S. PATENT DOCUMENTS

| | | |
|---|---|---|
| 4,295,117 | 10/1981 | Lake . |
| 4,772,217 | 9/1988 | Petersen .................................. 439/278 |
| 4,866,989 | 9/1989 | Lawless . |
| 5,233,873 | 8/1993 | Mozgowiec et al. ...................... 73/493 |
| 5,581,032 | 12/1996 | Uemura et al. ........................... 73/493 |
| 5,650,567 | 7/1997 | Ueda et al. ............................... 73/493 |
| 5,767,404 | 6/1998 | Kaiser et al. ......................... 73/504.13 |

FOREIGN PATENT DOCUMENTS

| | | |
|---|---|---|
| 0297961A2 | 1/1989 | European Pat. Off. . |
| 0566758A1 | 10/1993 | European Pat. Off. . |
| 0678730A1 | 10/1995 | European Pat. Off. . |
| 0704701A2 | 4/1996 | European Pat. Off. . |
| 4436523 | 4/1918 | Germany . |
| 57131031 | 8/1992 | Japan . |

*Primary Examiner*—Richard A. Moller
*Attorney, Agent, or Firm*—Herbert L. Lerner; Laurence A. Greenberg; Werner H. Stemer

[57] ABSTRACT

A sensor subassembly contains a base part that is formed of plastic and has a sensor holding region with sensor connections provided therein and a connection region with plug connections provided therein. A sensor element with electrical contacts is electrically conductively connected to the sensor connections. Fastened to the base part is a printed circuit board, via which an electrical connection between the sensor element and the plug connections is made.

14 Claims, 3 Drawing Sheets

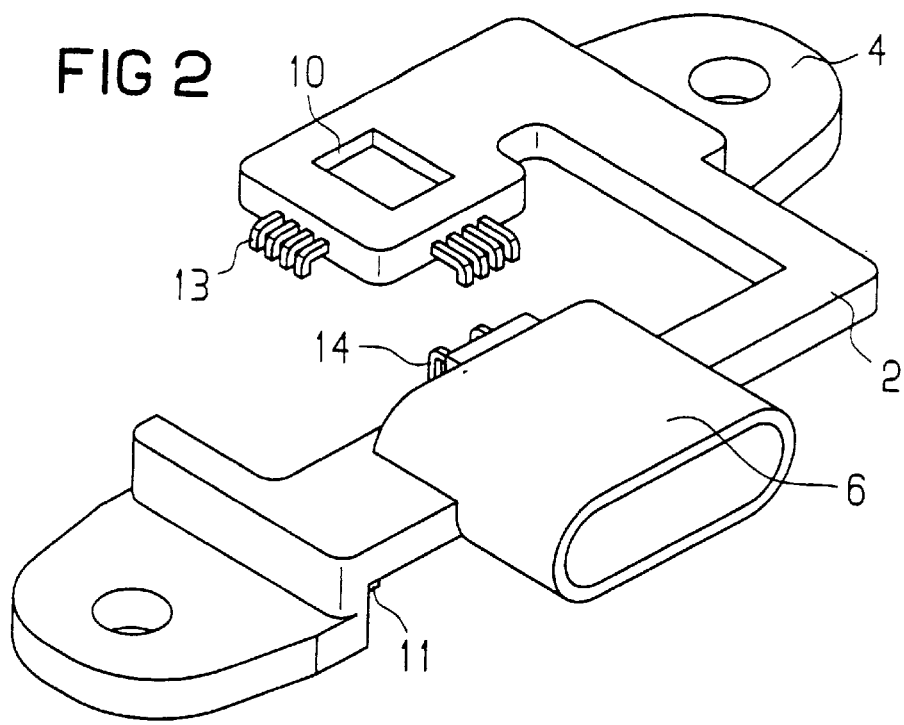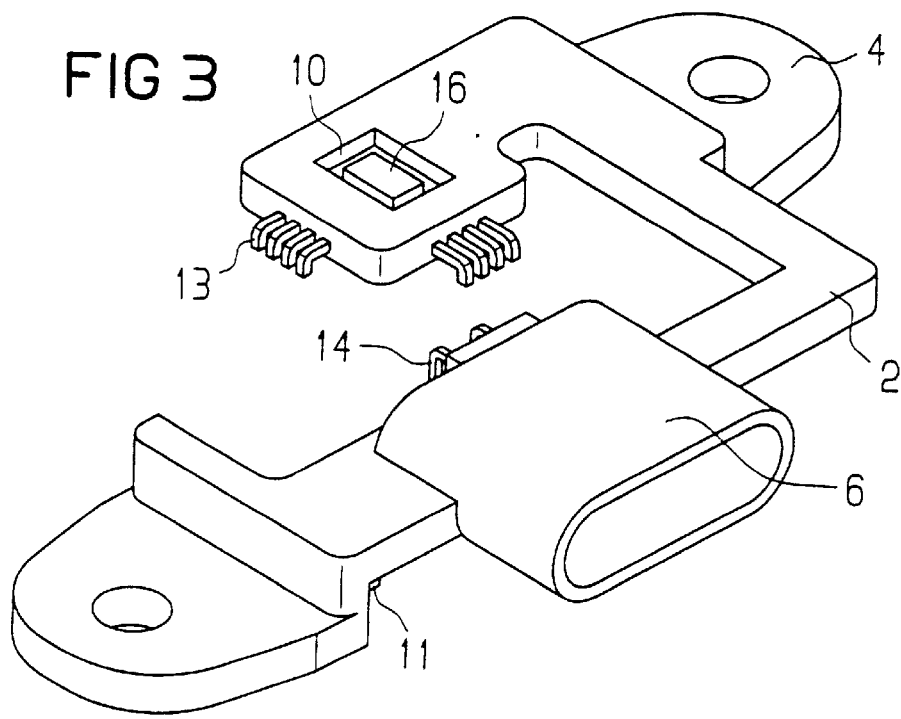

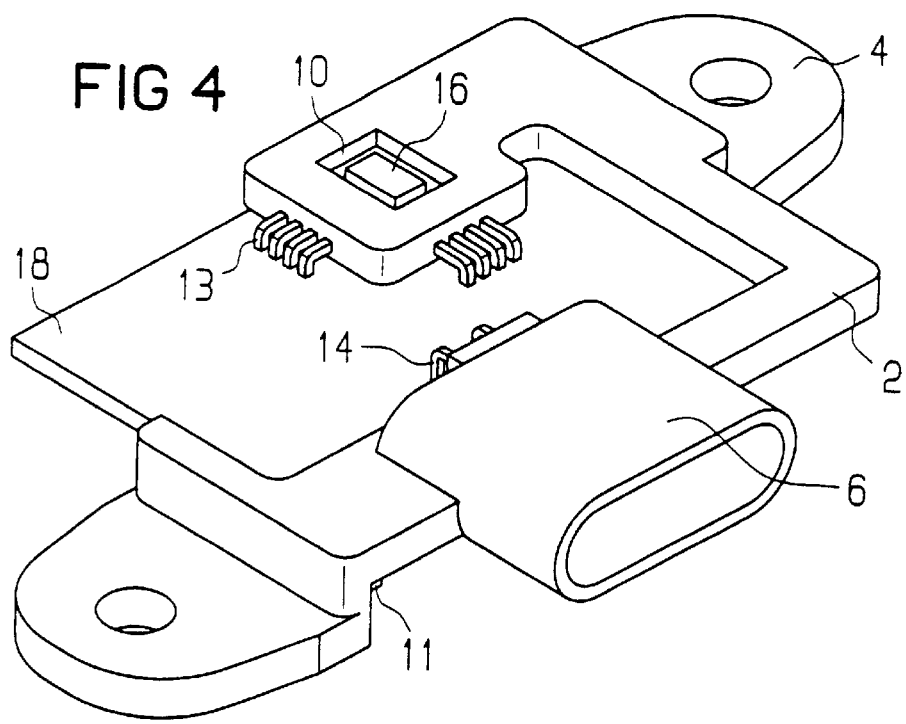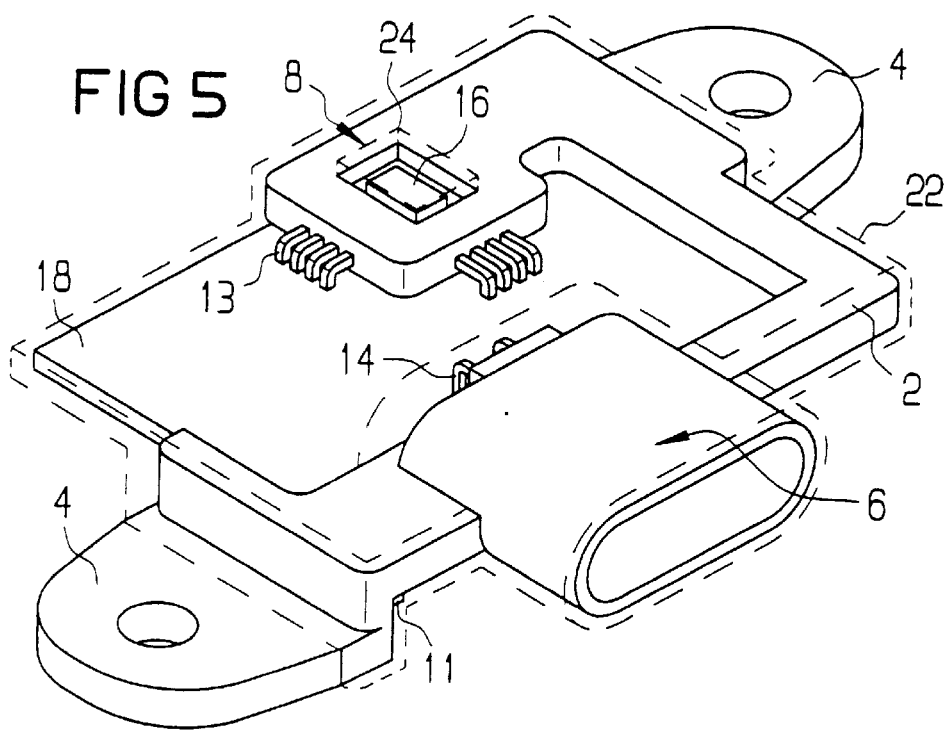

METHOD OF PRODUCING A SENSOR SUBASSEMBLY, AND SENSOR SUBASSEMBLY

CROSS-REFERENCE TO RELATED APPLICATION

This application is a continuation of copending International Application PCT/DE98/01130, filed Apr. 22, 1998, which designated the United States.

BACKGROUND OF THE INVENTION

Field of the Invention

The invention relates to a sensor subassembly and to a method of producing the sensor subassembly. Such sensor subassemblies are used, in particular, in occupant protection systems of motor vehicles.

With the increasing use of electronic controllers and regulators, increasing importance is attached to the sensors. Sensor subassemblies containing sensors should be capable of cost-effective production and should supply precise, reliable output signals for the circuits connected downstream of the controller. Simple mounting of the sensor or of the sensor subassembly provided with the sensor is a further important requirement. When such sensor subassemblies are used in occupant protection systems of motor vehicles, it is usually the acceleration of an inertial mass contained in the sensor element which is measured or, in particular in side impact protection devices, a pressure wave is registered which, for example, originates from sudden deformation of an outer panel of a door.

Published, European Patent Application EP 0 297 961 A2 shows a sensor subassembly of the generic type whose sensor element responds to pressure. The sensor subassembly has a base part made of plastic, which is injection-molded around a punched grid. Sensor connections of a punched grid end within a sensor holding region formed by a hole in the base part. Towards one end, the base part is configured as a plug, from which ends of the punched grid project as plug connections. A sensor element is fastened to a supporting part that consists of plastic, which can be inserted into the hole-like sensor holding region and is electrically connected to the sensor connections, for example by use of a bonding. A further component, which engages over the sensor, is subsequently clipped to the base part. Overall the sensor subassembly is of relatively complicated construction. Before the evaluation of output signals from the sensor element which are picked off via the plug connections, a further device is needed for processing the signals in an EDP-suitable form, since signal processing directly on the sensor subassembly is not provided. Published, European Patent Application EP 0 566 758 A1 discloses a sensor subassembly whose sensor element is sensitive to acceleration. The sensor element is soldered to a printed circuit board by connecting legs and is additionally held on holding arms that are connected to the printed circuit board. The printed circuit board is disposed within a housing having insulating material which protects the sensor element from extremely hard impacts being disposed between the printed circuit board and the housing, and between the sensor element and the housing. The construction of this known sensor unit is also relatively complicated.

SUMMARY OF THE INVENTION

It is accordingly an object of the invention to provide a method of producing a sensor subassembly, and a sensor subassembly which overcome the above-mentioned disadvantages the prior art methods and devices of this general type, in particular a sensor subassembly which can be used in occupant protection systems of motor vehicles, which, with the capability of simple implementation, permits the costeffective production of sensor subassemblies which can be adapted to different requirements and operate reliably.

The invention is further based on the object of providing a sensor subassembly that can be produced cost-effectively in large numbers, can be adapted to the different requirements and has a high reliability.

With the foregoing and other objects in view there is provided, in accordance with the invention, a method of producing a sensor subassembly, which includes producing a plastic base part having a sensor holding region and a connection region; fastening a printed circuit board to the plastic base part; fitting a sensor element to the plastic base part and providing sensor connections for producing an electrical connection between the sensor element and the printed circuit board; and placing plug connections that extend from the connection region to the printed circuit board for providing an electrical connection between the printed circuit board and the plug connections.

A significant feature of the method according to the invention is based on the fact that a printed circuit board is fastened to the finished base part. It being possible for the printed circuit board to be equipped to correspond to the respective requirements, so that, in spite of different sensor elements and printed circuit boards with different equipment or different configurations, the same base part can be used in large numbers for the different configurations. The tolerances on the sensor subassembly are reduced to a minimum by the prefabricated base part having the sensor holding region and the connection region.

According to another embodiment of the invention, the finished, equipped printed circuit board is fastened to the base part, so that the sensor subassembly can be used as a satellite in a complex circuit.

According to a further embodiment of the invention, the plug connections are advantageously cast into the base part during production of the latter. It goes without saying that pressing or any other suitable fastening is also possible.

According to an additional embodiment of the invention, the simple fitting of the sensor element and its electrical connection are provided by the configuration of the base part.

According to yet another embodiment of the invention, the advantage that accelerations which act on the base part are transmitted directly to the sensor element, since the latter is virtually formed in one piece with the base part as a result of the adhesive bonding, is achieved.

According to yet a further embodiment, it is advantageous for recesses that fix the printed circuit board geometrically to be provided on the base part.

According to an added feature of the invention, the sensor subassembly which is compact and, if appropriate, hermetically sealed, and in which only the plug connections and, if necessary, a channel to the sensor element, are free to the outside, it being possible for the channel to be provided, for example, when the sensor element is a pressure-sensitive sensor element. It goes without saying that a diaphragm can additionally be provided directly over the sensor element. The fact that the geometric configuration between the plug connections and the sensor element is defined directly by the base part results in that the injection mold, in which a channel to the sensor element and the access to the plug connections has to remain free, can be produced with very accurate tolerances. In this way, a satisfactory quality of the completely ready-to-mount and sealed sensor subassembly is obtained.

The fact that the printed circuit board can contain the entire drive and/or evaluation circuit for the sensor element provides a cost-effective and, at the same time, functionally reliable sensor subassembly, which reduces the requirements on the further circuit environment.

In addition to the ability of the sensor subassembly to be produced simply and with accurate tolerances, numerous further advantages are achieved by the invention. For example, if the sensor element is sensitive to acceleration, precise transmission of movement from a component, to which the base part is fastened, to the sensor element itself, is achieved. The transmission of movement includes only the interfaces between the component whose acceleration is to be measured and the base part (and, if appropriate, its covering), and between the base part and the sensor element. This leads to a very good and well-defined measuring sensitivity.

Other features which are considered as characteristic for the invention are set forth in the appended claims.

Although the invention is illustrated and described herein as embodied in a method of producing a sensor subassembly, and a sensor subassembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2 to 4 are perspective views of various stages in the production of the sensor subassembly; and FIG. 5 is a perspective view of the finished, encapsulated sensor subassembly.

DESCRIPTION OF THE PREFERRED EMBODIMENTS

Figure 1:
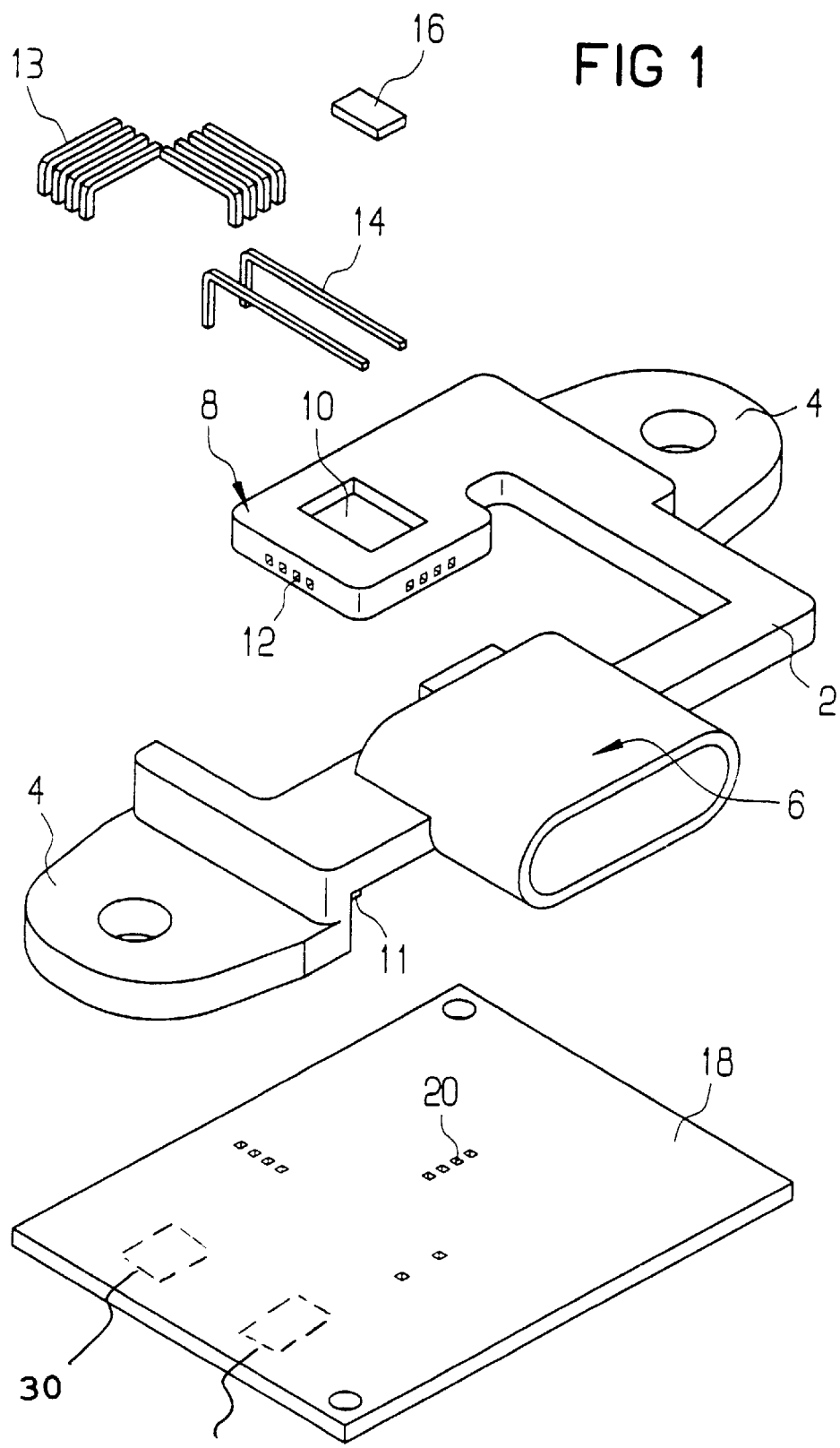
FIG. 1 is a diagrammatic, exploded, perspective view of components of a sensor subassembly.

In all the figures of the drawing, sub-features and integral parts that correspond to one another bear the same reference symbol in each case. Referring now to the figures of the drawing in detail and first, particularly, to FIG. 1 thereof, there is shown a base part 2 which consists of plastic and forms a frame for an entire sensor subassembly and, for example, is injection-molded. Provided on the base part 2 are fastening eyes 4, as well as a connection region 6, which forms a sleeve for the insertion of a plug, and a sensor holding region 8 which is formed with a recess 10. The base part 2 also has recesses 11 to hold a printed circuit board 18 which is described later.

Provided on the sensor holding region 8 are holes 12. A non-illustrated rear wall of the connection region 6 also has holes.

The subassembly also includes connecting pins 13 and 14 which, in order to be handled more easily, are initially supplied as a punched grid structure. A sensor element 16, which can be formed as a chip having electrical contacts that are exposed to the outside but not visible, is further provided. The sensor element 16 can respond, for example, to pressure changes or to accelerations. As an acceleration sensor 16, it contains for example a seismic, inertial mass, whose deflections are registered. As a pressure sensor 16, it contains for example a pressure-sensitive element, such as a piezo-electric element, a diaphragm and so on.

Also provided is the printed circuit board 18 that, on its rear side, is equipped with electronic components that form a drive circuit 30 and/or an evaluation circuit 35 for the sensor element 16. The printed circuit board 18 is provided with holes 20, into which the connecting pins 13, 14 can be introduced and where they can be connected electrically, for example by soldering.

The assembly of the components illustrated in FIG. 1 takes place as described now below.

According to FIG. 2, in a first method step the connecting pins 13 and 14 are pressed into the holes provided for this in the base part 2. Alternatively, the connecting pins 13 can also be introduced directly into the mold during the injection molding of the base part 2, so that they are integrated into the base part 2 directly during the injection molding of the latter. Those regions of the connecting pins 13 which project into the recess 10 form sensor connections for making electrical contact with the sensor element 16. Those regions of the connecting pins 14 that project into the connection region 6 can form the plug connections directly.

In a subsequent method step (FIG. 3), the sensor element 16 is introduced into the recess 10 and, for example, adhesively bonded to a bottom of the recess 10. It goes without saying that the configuration of the sensor element 16 in the recess 10 is carried out in a geometrically well-defined manner, by the bottom of the recess 10 being provided with an appropriate cutout or by non-illustrated webs which position the sensor element 16 being formed within the recess 10. The non-illustrated electrical contacts of the sensor element 16 are then soldered directly to the connecting pins 13 or bonded by wires.

In a next method step (FIG. 4), the printed circuit board 18 is introduced from below into the base part 2. The underside (not visible) of the base part 2 with the appropriate recesses 11 forming guide and supporting surfaces which ensure that the free ends of the connecting pins 13.project into holes 20 in the printed circuit board 18 and can be soldered from the rear to conductor tracks of the printed circuit board 18 or pressed into the latter. It goes without saying that the base part 2 and the printed circuit board 18 can be provided with latching devices for mutual latching.

The sensor element 16 is then connected to the printed circuit board 18 via the connecting pins 13. The printed circuit board 18 is connected via the connecting pins 14 to the plug connections (formed, for example, by the free ends of the connecting pins 14) which project into the interior of the connection region 6 but are not visible in FIG. 5. In a final method step (FIG. 5), the entire subassembly is provided with a covering 22 (shown by dashed lines) in an injection-molding or casting operation, access to the connection region 6 and advantageously also the fastening eyes 4 remaining free. If the sensor element 16 is pressure-sensitive, a channel 24 to a pressure-sensitive region of the sensor element 16 or to the entire sensor element 16 remains free, in order to apply to the latter the pressure to be measured.

Otherwise, the entire subassembly is hermetically sealed off from the outside by the covering 22 and is intrinsically extremely rugged.

During the injection molding or the encapsulation, there is a unique correspondence between the channel 24, if present, and that region of the connection region 6 which remains free, since the geometry is exclusively determined by the base part 2. This ensures a satisfactory quality of the sensor subassembly. Furthermore, the subassembly is provided with all the necessary electronics, so that a plug that can be inserted into the connection region 6 is used only for the power supply and for the connection of already processed output signals to an electronic controller, for example.

Via the fastening eyes 4, the entire sensor subassembly can be screwed directly onto a component whose acceleration or whose vibration behavior, for example, is to be measured. The measurement is very precise, since the vibrations have to pass only through the interface between the component to be measured (not illustrated) and the base part 2 and the interface between the base part 2 and the sensor element 16.

It goes without saying that numerous modifications are possible. For instance, the sensor element 16 can be fastened merely by being soldered to the connecting pins 13.

Furthermore, the printed circuit board 18 can additionally be adhesively bonded to the base part 2. The recess can be free of the covering 22 in the region of the sensor element 16 and can be closed by a cover, so that the sensor element 16 is accessible, for example for replacement. The printed circuit board can be configured as a punched grid (lead frame).

I claim:

1. A method of producing a sensor subassembly, which comprises:

producing a plastic base part having a sensor holding region and a connection region;

fastening a printed circuit board to the plastic base part;

fitting a sensor element to the plastic base part and providing sensor connections for producing an electrical connection between the sensor element and the printed circuit board; and placing plug connections that extend from the connection region to the printed circuit board for providing an electrical connection between the printed circuit board and the plug connections.

2. The method according to claim 1, which comprises equipping the printed circuit board with at least one of a drive circuit and an evaluation circuit for controlling and evaluating the sensor element before the printed circuit board is fitted to the plastic base part.

3. The method according to claim 1, which comprises casting the plug connections into the plastic base part during the step of producing the plastic base part.

4. The method according to claim 1, which comprises fitting the sensor connections to the plastic base part and producing an electrical connection between the sensor element and the sensor connections and between the sensor connections and the printed circuit board.

5. The method according to claim 4, which comprises casting the sensor connections into the plastic base part during the step of producing the plastic base part.

6. The method according to claim 1, which comprises using an adhesive bonding for fastening the sensor element to the plastic base part.

7. The method according to claim 1, which comprises inserting the printed circuit board into recesses provided on the plastic base part.

8. The method according to claim 1, which comprises encapsulating the plastic base part, the printed circuit board and the sensor element with a plastic applied by injection molding but leaving free the plug connections within the connection region.

9. The method according to claim 1, which comprises encapsulating the plastic base part, the printed circuit board and the sensor element with a plastic applied by injection molding but leaving free the plug connections within the connection region and a channel to the sensor element.

10. A sensor subassembly, comprising:

a plastic base part having a sensor holding region and a connection region;

sensor connections disposed and held in said plastic base part in said sensor holding region;

plug connections disposed and held in said plastic base part in said connection region;

a sensor element with electrical contacts electrically conductively connected to said sensor connections; and a printed circuit board fastened to said plastic base part and making an electrical connection between said sensor element and said plug connections.

11. The sensor subassembly according to claim 10, wherein said sensor element contains an acceleration sensor and is fastened directly to said plastic base part.

12. The sensor subassembly according to claim 10, wherein said printed circuit board contains at least one of a drive circuit and an evaluation circuit for driving and evaluating said sensor element.

13. The sensor subassembly according to claim 10, including a covering formed by encapsulating said plastic base part, said printed circuit board and said sensor element with plastic applied by injection molding, said covering not enclosing said plug connections within said connection region.

14. The sensor subassembly according to claim 10, including a covering formed by encapsulating said plastic base part, said printed circuit board and said sensor element with plastic applied by injection molding, said covering not enclosing said plug connections within said connection region and a channel formed therein to said sensor element.

* * * * *